(12) United States Patent
Freeman et al.

(10) Patent No.: US 7,749,822 B2
(45) Date of Patent: Jul. 6, 2010

(54) METHOD OF FORMING A RESISTOR AND AN FET FROM THE METAL PORTION OF A MOSFET METAL GATE STACK

(75) Inventors: Gregory G. Freeman, Hopewell Junction, NY (US); William K. Henson, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 11/869,271

(22) Filed: Oct. 9, 2007

(65) Prior Publication Data

US 2009/0090977 A1 Apr. 9, 2009

(51) Int. Cl.
*H01L 21/00* (2006.01)
*H01L 27/12* (2006.01)

(52) U.S. Cl. ...................... 438/155; 257/350
(58) Field of Classification Search ................. 257/379, 257/350, 363, E21.004–E21.007; 438/210, 438/152–156
See application file for complete search history.

(56) References Cited

U.S. PATENT DOCUMENTS

| | | | |
|---|---|---|---|
| 6,300,201 B1 | 10/2001 | Shao et al. | |
| 6,462,386 B2 | 10/2002 | Moriwaki et al. | |
| 6,465,294 B1 | 10/2002 | Tsai et al. | |
| 7,084,024 B2 | 8/2006 | Gluschenkov et al. | |
| 7,112,535 B2 | 9/2006 | Coolbaugh et al. | |
| 2001/0038128 A1* | 11/2001 | Woolery et al. | 257/363 |
| 2007/0148838 A1 | 6/2007 | Doris et al. | |
| 2007/0281418 A1* | 12/2007 | Hu et al. | 438/238 |
| 2008/0206939 A1* | 8/2008 | Min et al. | 438/197 |
| 2008/0237750 A1* | 10/2008 | Tsai et al. | 257/412 |

* cited by examiner

*Primary Examiner*—Calvin Lee
(74) *Attorney, Agent, or Firm*—Graham S. Jones; H. Daniel Schnurmann

(57) ABSTRACT

An integrated semiconductor device includes a resistor and an FET device formed from a stack of layers. The stack of layers includes a dielectric layer formed on a substrate; a metal conductor layer having lower electrical resistance formed on the dielectric layer; and a polysilicon layer formed on the metal conductor layer. A resistor stack is formed by patterning a portion of the original stack of layers into a resistor. An FET stack is formed from another portion of the original stack of layers. The FET stack is doped to form a gate electrode and the resistor stack is doped aside from the resistor portion thereof. Then terminals are formed at distal ends of the resistor in a doped portion of the polysilicon layer. Alternatively, the polysilicon layer is etched away from the resistor stack followed by forming terminals at distal ends of the metal conductor in the resistor stack.

19 Claims, 12 Drawing Sheets

METHOD OF FORMING A RESISTOR AND AN FET FROM THE METAL PORTION OF A MOSFET METAL GATE STACK

BACKGROUND OF THE INVENTION

The present invention relates to semiconductor devices and more particularly to a process for fabricating polysilicon resistors for use in integrated circuits including Field Effect Transistor (FET) devices.

Heretofore, in the case of Complementary Metal Insulator Semiconductor (CMIS) Complementary Metal Oxide Semiconductor (CMOS) (FET) technology, it has been typical for the gate electrode stack of a Metal Oxide (MOS) FET device to comprise a conductor in the form of a doped polysilicon gate electrode formed over a gate dielectric layer composed of a dielectric material such as silicon oxide. A disadvantage of utilizing polysilicon gates is that at inversion, polysilicon gate electrodes generally experience depletion of carriers in the area of the polysilicon gate adjacent to the gate dielectric. Such depletion of carriers, which is referred to in the art as the polysilicon depletion effect, reduces the effective gate capacitance of the Metal Insulator Semiconductor (MIS) device. More recently MIS FET devices have substituted high-K gate dielectric materials for the materials such as silicon oxide of MOS FET devices and metal gates have been substituted for polysilicon or combined therewith. Thus a gate electrode stack may comprise a complex stack of high K dielectric material, a metal layer, a layer of doped polysilicon, and a silicide layer. In CMOS devices including a gate stack comprising a bottom polysilicon portion and a top silicide portion a layer of silicide in such a gate stack contributes to a decrease in the resistance of the gate. The decrease in resistance causes a decrease in the time propagation delay RC of the gate. Although a silicide top gate region may help to decrease the resistance of the transistor, charge is still depleted in the vicinity of the interface formed between the bottom polysilicon gate and gate dielectric, thereby causing a smaller effective gate capacitance.

Commonly assigned copending U.S. Patent Application No. 2007/0148838 of Doris et al. entitled "Metal Gate CMOS with at Least a Single Gate Metal and Dual Gate Dielectrics" states that in one type of "CMOS device the gate electrode includes at least a metal layer beneath a Si-containing, e.g., polysilicon, gate electrode."

Typical resistor processing provides for a doped polysilicon resistor body, where a block layer is employed to exclude the low resistance silicidation from the resistor body. This approach can have drawbacks due to the multiple process steps that influence the resistance value, and thus increase resistor tolerance.

An alternative to employing a doped polysilicon resistor body, where a block layer is employed to exclude the low resistance silicidation from the resistor body is to utilize a separately processed resistor layer, for instance in the (Back End Of the Line) BEOL processing of the device. This adds significant process costs to the technology due to additional deposition, lithography and etching steps.

U.S. Pat. No. 6,462,386 of Moriwaki et al. entitled "Semiconductor Device and Method of Manufacturing the Same" describes a semiconductor device comprising a first MOSFET and a second MOSFET. The first MOSFET includes a first gate insulating film formed on a semiconductor substrate and having a relatively large thickness and a first gate electrode composed of a polysilicon film formed on the first gate insulating film. The second MOSFET includes a second gate insulating film formed on the semiconductor substrate with a relatively small thickness and a second gate electrode composed of a metal film made of a refractory metal or a compound of a refractory metal and over on the second gate insulating film.

U.S. Pat. No. 7,112,535 of Coolbaugh et al. entitled "Precision Polysilicon Resistor Process" which is commonly assigned describes a process for fabricating precision polysilicon resistors which more precisely control the tolerance of the sheet resistivity of the produced polysilicon resistors. The process includes performing an emitter/FET activation Rapid Thermal Anneal (RTA) on a wafer having partially formed polysilicon resistors, followed by steps of depositing a protective dielectric layer on the polysilicon, implanting a dopant through the protective dielectric layer into the polysilicon to define the resistance of the polysilicon resistors, and forming a silicide. The process included forming a first gate insulating film, having a relatively large thickness, on a semiconductor substrate followed by forming thereon a first gate electrode composed of a polysilicon film. A second FET includes a second gate insulating film formed on the semiconductor substrate which has a relatively small thickness; and forming thereon a second gate electrode composed of a metal film, and a barrier metal covering the sides and bottom of the first gate electrode formed in between the second gate insulating film and the second gate electrode. A resistor is composed of a polysilicon film formed in the step of forming the polysilicon film of the first gate electrode.

SUMMARY OF THE INVENTION

The present invention utilizes a process of forming both a resistor and an FET from dual layers including a metal layer and a polysilicon layer. The pair of layers can be formed into both a gate electrode stack and a resistor stack by selective processing of different regions of the dual layers.

An advantage of the method and the resulting structure is that the metal layer thickness is tightly controlled thereby providing an excellent resistor tolerance. The metal layer thickness naturally provides for a suitable resistor sheet resistance value of between 50-300 Ω/square.

Another advantage is that the resistor formed by the metal layer within the gate electrode stack will be on the same chip as MOSFETs fabricated with HiK metal gate stack and will have no additional cost.

The invention and objects and features thereof will be more readily apparent from the following detailed description and appended claims when taken with the drawings.

In accordance with this invention, an integrated semiconductor device is formed on a substrate which includes a Field Effect Transistor (FET) device and a resistor adjacent thereto. A stack of layers is provided comprising a dielectric layer formed on the substrate, a metal conductor layer formed on the dielectric layer, and a polysilicon layer formed on the metal conductor layer. The stack of layers is patterned into the resistor and the FET device. The FET device is composed of a gate electrode stack formed from the dielectric layer, the metal conductor layer and the polysilicon layer with the polysilicon layer in the FET device being doped and conductive. Distal ends of the polysilicon layer of the resistor are doped and conductive, and between the distal ends of the resistor the polysilicon layer is undoped and nonconductive.

Preferably, conductive electrical terminals are formed on the distal ends of the resistor with one of the conductive terminals being connected to the FET device. Preferably, the dielectric layer comprises a High-K material selected from a hafnium based material and a material selected from the group consisting of hafnium zirconate ($HfZrO_4$), hafnium silicon oxynitride (HfSiON), hafnium dioxide (HfO$_2$) and hafnium silicate (HfSiO), La$_2$O$_5$, HfLaO, Hf silicates, nitrided Hf silicates, hafnium dioxide (HfO$_2$) with La, N, and Mg, Hf silicates with La, N, Mg, and aluminum oxide. Preferably, the dielectric layer comprises a High-K material and the metal conductor is composed of a material selected from the group consisting of titanium nitride (TiN) and tantalum carbide (TaC,) TaN, Ta, Ru, Ni, NiSi, CoSi$_2$, and TiAlN.

In accordance with another aspect of this invention, a method is provided for forming an integrated semiconductor device on a substrate including an Field Effect Transistor (FET) device adjacent to a resistor. The method comprises the following steps. Form a stack of layers on the substrate including a dielectric layer formed on the substrate, a conductive layer formed on the dielectric layer and an undoped polysilicon layer formed on the conductive layer. Form an FET stack for the FET device and a resistor stack for the resistor by patterning and etching the dielectric layer, the conductive layer, and the polysilicon layer, implant dopant into the FET stack to form doped polysilicon gate electrode for the FET device. Implant dopant into distal ends of the resistor stack without implanting dopant between the distal ends, thereby forming the resistor between the distal ends. Preferably, form resistor terminals connected to the distal ends of the resistor stack, form FET terminals connected to the FET device, and connect one of the resistor terminals to one of the FET terminals.

Preferably, the dielectric layer comprises a High-K material. Preferably, the dielectric layer comprises a High-K material group consisting of hafnium based materials. Preferably, the dielectric layer comprises a High-K material comprising a material selected from the group consisting of hafnium zirconate (HfZrO$_4$), hafnium silicon oxynitride (HfSiON), hafnium dioxide (HfO$_2$) and hafnium silicate (HfSiO). Preferably, the dielectric layer comprises a High-K material, and the metal conductor is composed of a material selected from the group consisting of titanium nitride (TiN) and tantalum carbide (TaC.) Preferably, the polysilicon in the distal ends comprises doped polysilicon and central regions of the polysilicon between the distal ends is undoped, and the metal conductor is composed of a material selected from the group consisting of titanium nitride (TiN) and tantalum carbide (TaC.) Preferably, the polysilicon layer is thin, and silicide contacts are formed from the polysilicon layer reaching down to the metal conductor layer.

In accordance with another aspect of this invention, another method is provided for method of forming an integrated semiconductor device on a substrate including an Field Effect Transistor (FET) device adjacent to a resistor comprises the following steps. Form a stack of layers on the substrate including a dielectric layer formed on the substrate, a conductive layer formed on the dielectric layer, and an undoped polysilicon layer on the conductive layer. Form an FET stack and a resistor stack by patterning and etching the dielectric layer, the conductive layer, and the polysilicon layer. Etch away the polysilicon from the resistor stack to form the resistor from the conductive layer, with the resistor having distal ends, and implant dopant into the FET stack to form a doped FET gate electrode for the FET device from the undoped polysilicon layer.

Preferably, form resistor terminals connected to the distal ends, form FET terminals connected to the FET device, and connect one of the resistor terminals to one of the FET terminals. Preferably, the dielectric layer comprises a High-K material comprising a High-K material group consisting of hafnium based materials or a material selected from the group consisting of hafnium zirconate (HfZrO$_4$), hafnium silicon oxynitride (HfSiON), hafnium dioxide (HfO$_2$) and hafnium silicate (HfSiO). Preferably, the dielectric layer comprises a High-K material, and the metal conductor is composed of a material selected from the group consisting of titanium nitride (TiN) and tantalum carbide (TaC.)

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENTS

Step A

Figure 1A:
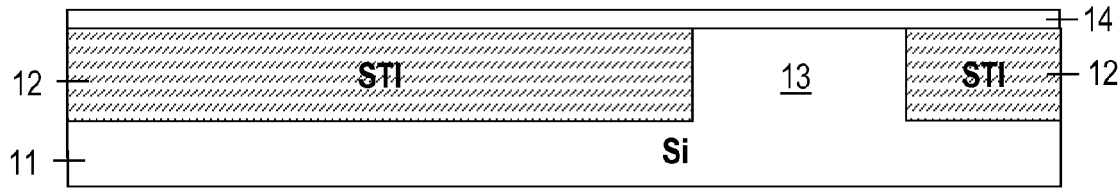
FIGS. 1A-1O shows the steps of manufacture in accordance with this invention of a semiconductor device with a resistor formed from a dual layer metal-polysilicon structure.

FIG. 1A shows a device 10 in an early stage of manufacture with a silicon semiconductor substrate 11. The substrate 11 may comprise a Silicon-On-Insulator (SOI) substrate or other known substrates which can support fabrication of integrated circuits. Between the STI regions 12 a source/drain/channel region 13 is defined in the silicon substrate 11. In order to produce the device 10 of FIG. 1A, a set of well known conventional processing steps employed in the early stages of fabrication of Complementary Metal Insulator Semiconductor (CMIS) Field Effect Transistor (FET) devices are performed including formation of a pair of Shallow Trench Isolation (STI) regions 12, formation of N wells and P wells, threshold adjustment implantation, all of which steps are well known by those skilled in the art.

A blanket insulator layer 14 has been thermally grown or deposited, over the surface of The device 10. Alternatively, any combination of these materials may be formed as needed for optimization of the electrical properties of a CMIS or CMOS FET device. Deposited films may reside as blanket films across the top of the isolation and the silicon regions. Typical thickness of each material is expected to be in the range of 0.5 nm to 10 nm. The blanket insulator layer 14 is composed of a material suitable for a gate dielectric layer such as silicon dioxide, silicon nitride, silicon oxynitride, or a high dielectric constant material, e.g. a hafnium dioxide (HfO$_2$) or hafnium zirconate (HfZrO$_4$), material or other known high dielectric constant material. Other possible hafnium high-K dielectric compounds include hafnium silicon oxynitride (HfSiON) and hafnium silicate (HfSiO.) Additional High-K materials include La$_2$O$_5$, HfLaO, Hf silicates, nitrided Hf silicates, hafnium dioxide (HfO$_2$) with La, N, and Mg, Hf silicates with La, N, Mg, and Al$_2$O$_3$.

Step B

Figure 1B:
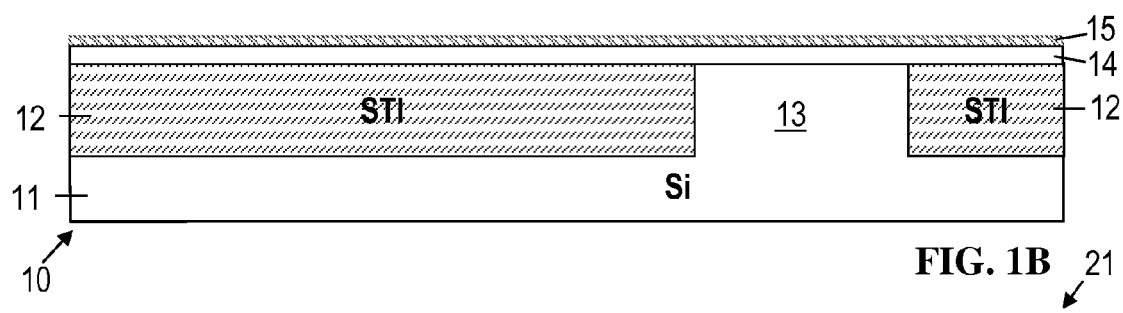

FIG. 1B shows the device 10 of FIG. 1A following deposition of a blanket metal layer 15 which is electrically conductive over the blanket insulator layer 14. While the composition of the metal layer 15 is not critical for this invention, its properties as applied to the embodiment of a transistor formed in the integrated circuit are critical. This metal may be composed of TiN or TaC (other metals: TaN, Ta, Ru, Ni, NiSi, CoSi2, TiAlN) or one any other material with suitable properties for inclusion in the gate electrode of an FET device. For the purpose of this invention, this layer forms a moderate resistivity layer, from 50 to 500 Ohms/square, with thickness expected in the range of 1-7 nm thereby providing adequate electrical conductivity to be used as an electrical resistor and a low enough electrical resistance to be employed in a dual layer gate electrode. Thus the blanket metal layer 15 should be composed of a material suitable to be formed into a gate electrode of a CMOS FET device and to be formed into an electrical resistor juxtaposed with the CMOS FET device.

Step C

Figure 1C:
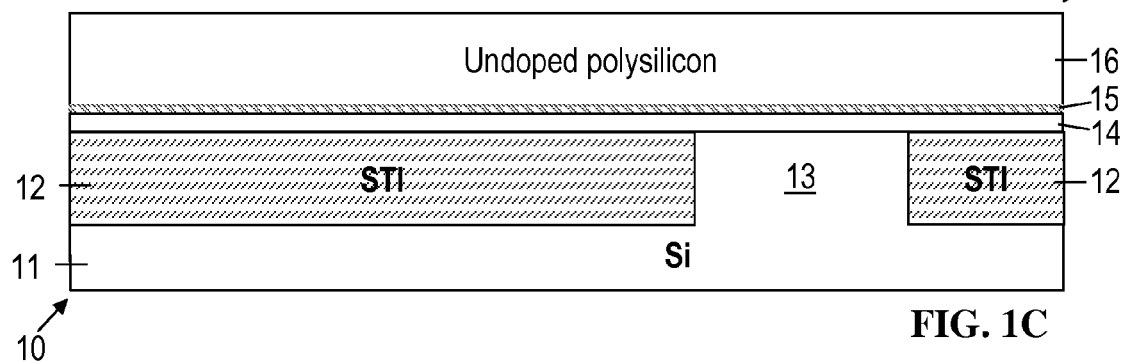

FIG. 1C shows the device 10 of FIG. 1B following deposition of a blanket, undoped polysilicon layer 16 over the blanket metal layer 15 comprising the complementary layer of the dual layers to be formed into an electrical resistor juxtaposed with a gate electrode of a CMOS FET device. The blanket insulator layer 14, the blanket metal layer 15, and the blanket, undoped polysilicon layer 16 comprise a feature blanket 21 which can be patterned into various features.

Step D

FIG. 10 shows the device 10 of FIG. 1C following formation of a patterned photoresist mask 18 in accordance with this invention. The mask is patterned to form the resistor and gate electrode stacks as described with reference to FIG. 1E.

Step E

Figure 1D:
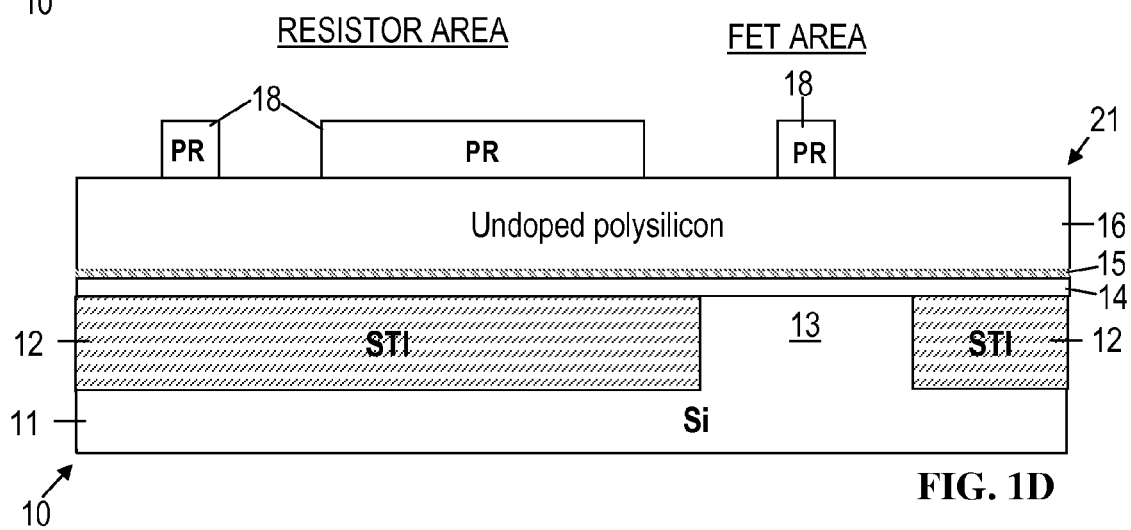
Figure 1E:
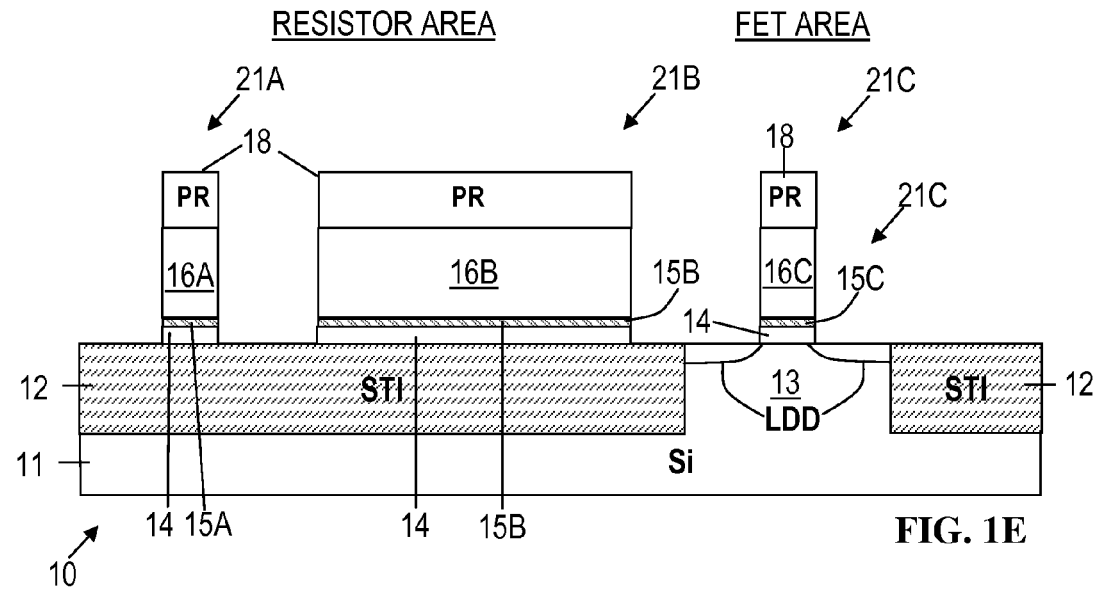

FIG. 1E shows the device 10 of FIG. 10 following after a step of anisotropic etching was applied to transfer the pattern of the photoresist mask 18 to the polysilicon layer 16 and the metal layer 15 at least, with the option of also patterning some of the insulator layers 14, which has been shown in FIG. 1D thereby forming perpendicular resistor stacks 21A and 21B over an STI region 12. The resistor stacks 21A and 21B are oriented at right angles to each other with stack 21A reaching lengthwise back into the page and stack 21B reaching lengthwise from right to left across the page and a gate electrode stack 21C. The patterned polysilicon layer 16 has been formed into an undoped polysilicon region 16C over the channel region 13. The undoped polysilicon region 16C is to be doped to provide a gate electrode for an FET. The undoped resistor polysilicon layer 16A and 16B of the dual layer resistors as shown have two different cross-sections. The patterned metal layer 15 has been formed into two metal resistor elements 15A and 15B oriented at right angles to each other with layer 16A reaching lengthwise back into the page and layer 16B reaching lengthwise from right to left across the page and a conductive element 15C over the channel region 13 which is a portion of the dual gate electrode FET. The patterned polysilicon layer 16 has been formed into undoped resistor polysilicon layers 16A and 16B of two resistors in perpendicular cross-sections, an undoped gate electrode polysilicon layer 16C for an FET. The patterned blanket insulator layer 14 comprises an incidental (i.e. not required for this invention) insulator feature for the resistor stacks 21A and 21B, but which comprises a gate dielectric for the gate electrode stack 21C. Then strip the photoresist layer 18.

Step F

Figure 1F:
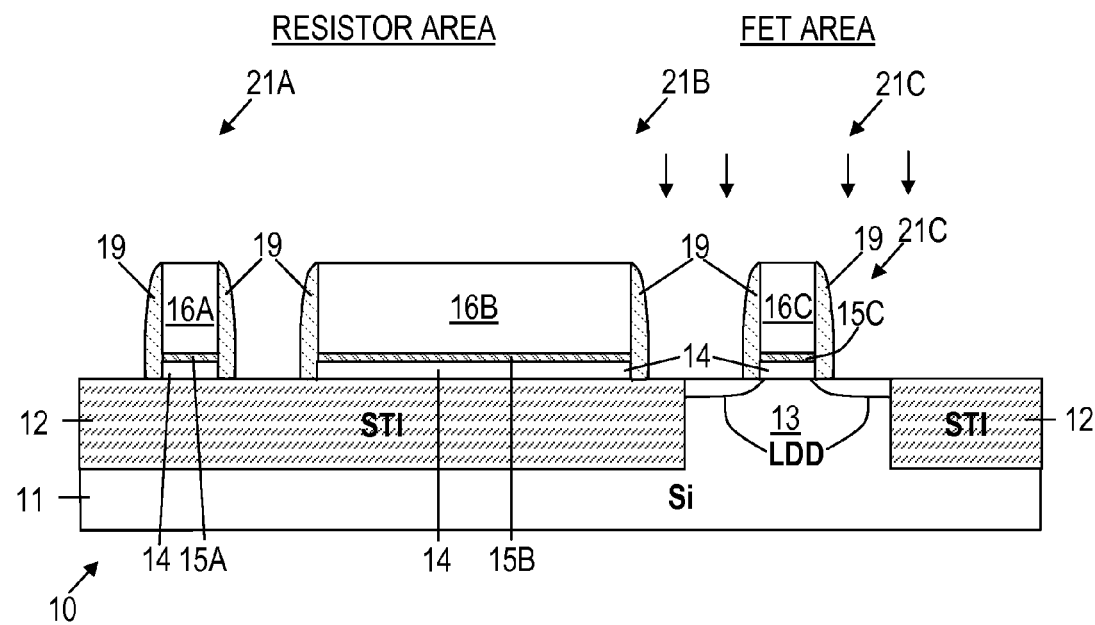

FIG. 1F shows the device 10 of FIG. 1E following removal of photoresist layer 18 and formation of sidewall spacers 19 on the sidewalls of the resistor stacks 21A and 21B and gate electrode stack 21C by conventional deposition of spacer layer followed by anisotropic etching of the spacer layer from planar regions of the devices. Then LDD (Lightly Doped Drain) implantation is performed into the source/drain region 13 for the purpose of defining a working MOSFET, and incidentally into the gate region 16C and resistor stack 16A and 16B. As the present invention pertains to the device and structure of a dual layer metal/polysilicon resistor, the low dosage of these implanted dopant ions into layers 16A and 16B will have a small effect on the resistivity of the device, they are not essential steps for the purpose of this invention, and do not harm the intended purpose of this invention. These steps may or may not be performed as needed by the MOSFET, so such description is left for those knowledgeable in MOSFET fabrication to define and implement. The spacers 19 are composed of silicon oxide.

Step G

Figure 1G:
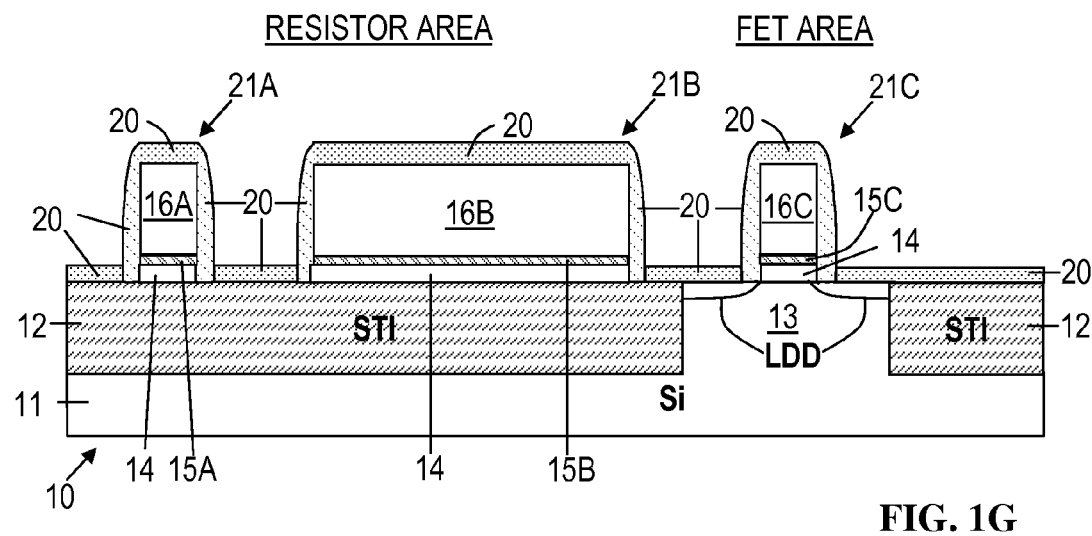

FIG. 1G shows the device 10 of FIG. 1F after formation of an insulating layer such as silicon nitride (Si$_3$N$_4$) deposited conformally over the polysilicon and the sidewalls of the polysilicon in addition to all exposed areas of the chip or wafer, which combined with layer 19 provides protective layers 20 (shown as a single layer for convenience of illustration.) This film thickness of the insulating layer is expected to be in the range 5-30 nm.

Step H

Figure 1H:
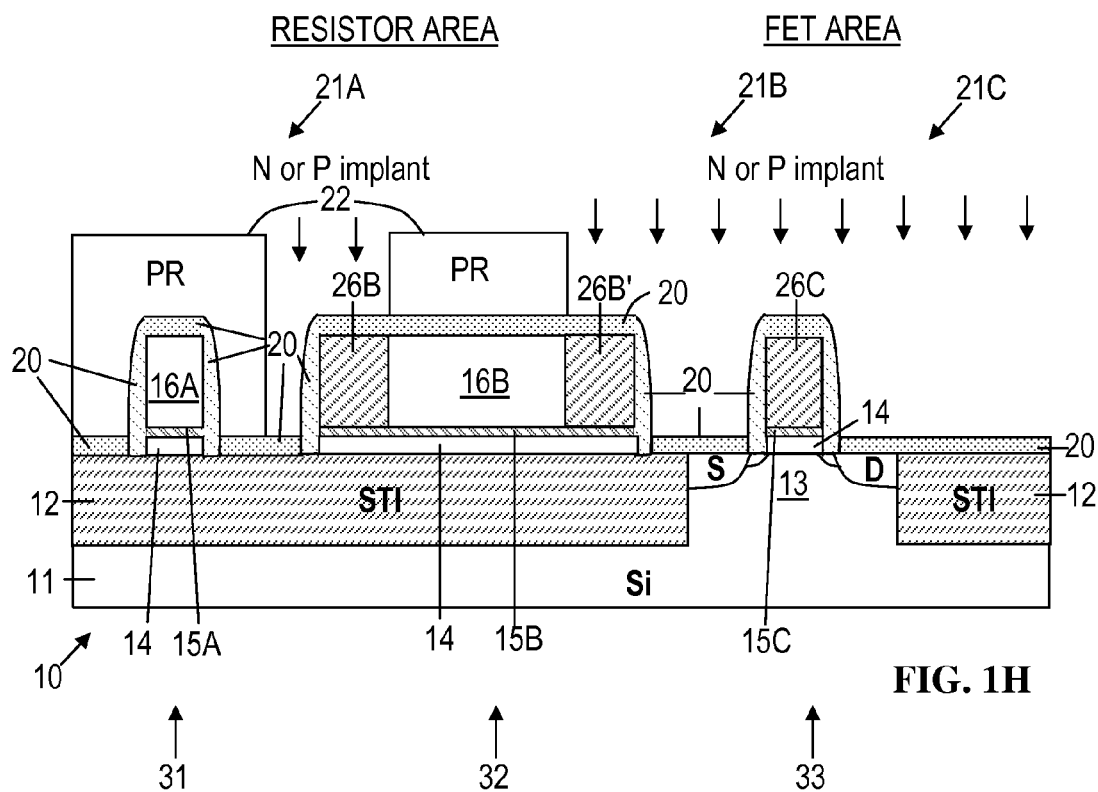

FIG. 1H shows the device 10 of FIG. 1G after application and patterning of a photoresist mask 22 which covers the middle regions of the a resistor stack, shown partially covering the cross-section 21B and completely covering the cross-section 21A, whereas the gate electrode stack 21C remains exposed. Then ion implantation is performed to form resistor terminals 26B by doping the distal ends of the resistor stack 21B while leaving the central region of the resistor polysilicon layer 16B undoped or lightly doped, thereby forming a resistor stack 21B with terminals 26B. In addition the dopant is introduced into the body 16C of the dual layer gate electrode 16C/15C forming a gate electrode stack 21C including the conductive gate electrode body 26C, the conductive element 15C and the gate dielectric layer 14 therebelow. At this point the resistor 31 on the left, the resistor 32 in the center and the FET 33 on the right have been formed by the formation of contacts at each end of the resistors 31 and 32 and the doping of the undoped polysilicon region 16C of the gate electrode stack which is now a doped, conductive gate electrode 26C. In the resistor stack 21B this process of ion implantation may employ either N-type or P-type dopant which will form a pair of conductive electrical terminals 26B at the distal ends of the previously undoped resistor polysilicon layer 16B. The conductive electrical terminals 26B are located adjacent to the protective layers 20 on the sides of the resistor polysilicon layer 16B (now 26B) and above the bottom metal layer 15B. The bottom metal layer 15B will comprise the resistor since the remaining undoped polysilicon 16B comprises a dielectric layer with much greater value of resistivity. The dopant also dopes the source/drain regions S/D shown in FIG. 1H. The photoresist mask 22 shown in FIG. 1H covers central portions of the resistor stacks to prevent the N or P implant dopant from reaching the polysilicon between the resistor terminals 26B in order to retain the high resistivity of the undoped polysilicon regions 16A and 16B as shown in FIG. 1H.

Step I

Figure 1I:
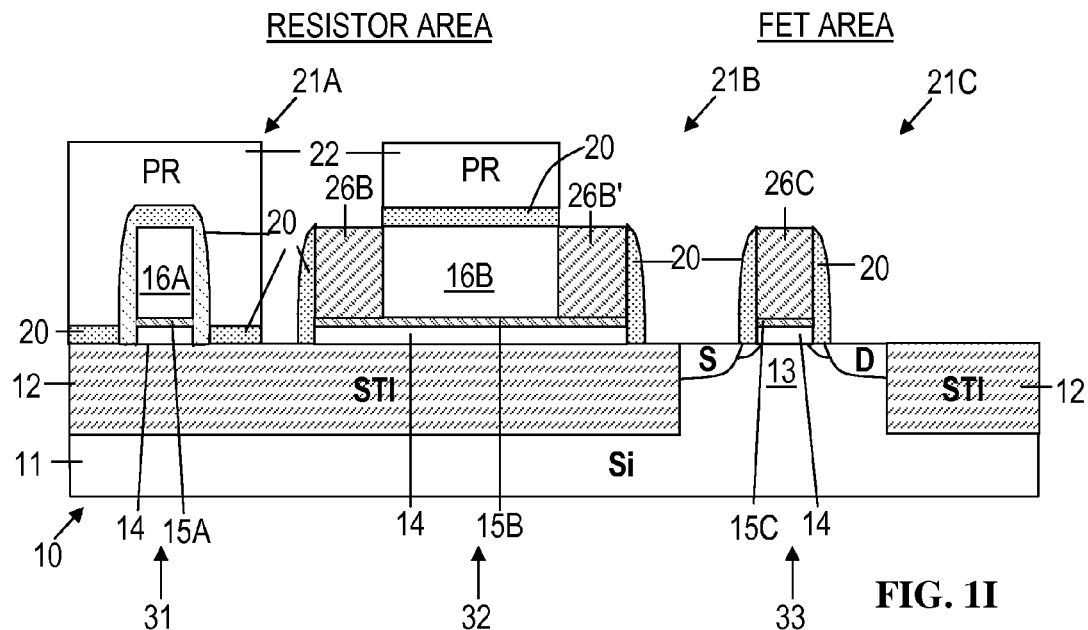

FIG. 1I shows the device 10 of FIG. 1H after etching of the exposed portions of the protective layers 20 which are composed of silicon nitride ($Si_3N_4$) is performed utilizing the photoresist mask 22 that defined the ion implantation in step H. The etch is selective leaving the spacers 19 composed of silicon oxide in place. The order of the just-described step H of ion implantation and the patterning of the protective layers 20 is not critical. The ion implantation step H may be performed either before or after the etching step I. This etched protective layers 20 may remain on the sidewalls of the doped polysilicon gate electrode 26C of the FET 33 and the resistor polysilicon layer 16B. The resistor cross-section 16A illustrates that the spacers 19 remain on the sidewalls of this portion of the resistor 16A, the same portion as the center region shown 16B as an alternate cross-section without sidewall. As will be seen—it is critical that the sidewalls of the resistors 31 and 32 remain covered through this and following steps. The planar region and the sidewalls of region 16A which are blocked from etching will later form a layer that inhibits the formation of a silicide conductive layer.

Step J

Figure 1J:
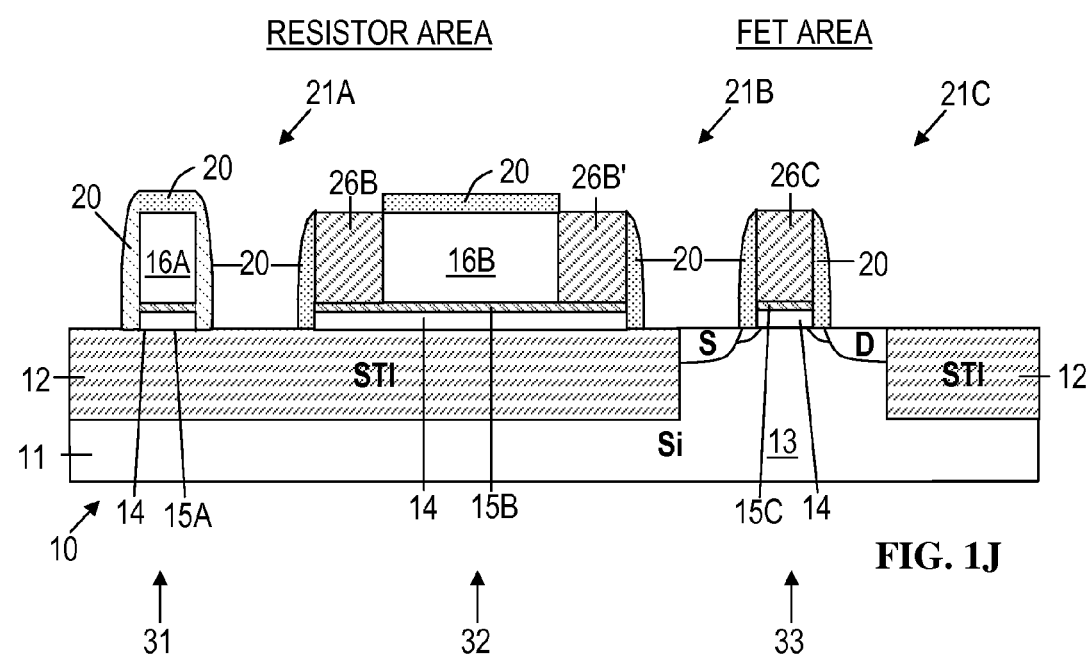

FIG. 1J shows the device 10 of FIG. 1I after the patterned photoresist mask 22 is removed by either a wet or a dry etch.

Step K

Figure 1K:
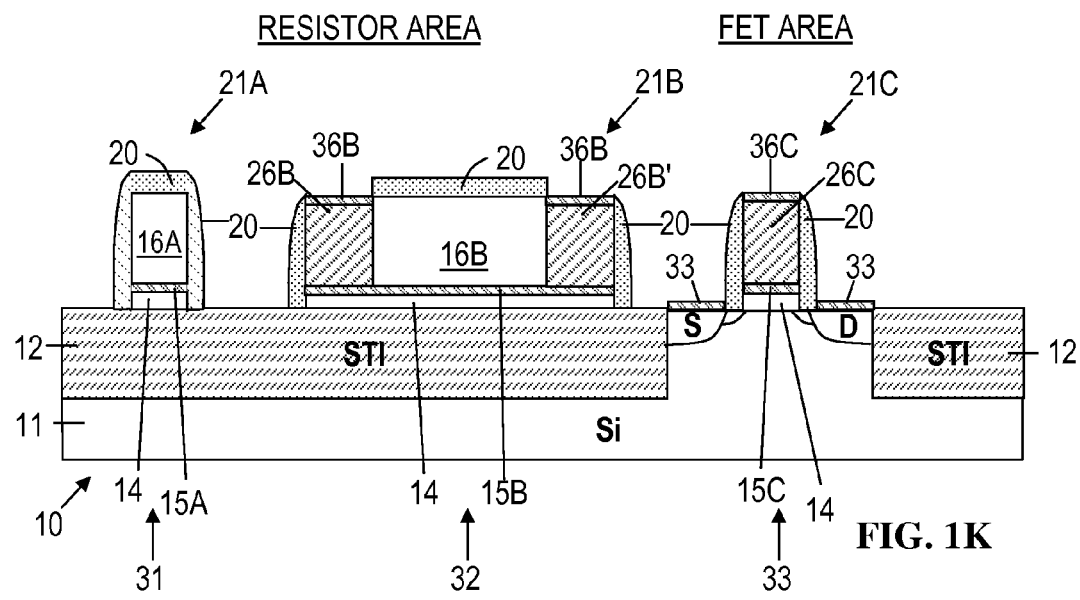

FIG. 1K shows the device 10 of FIG. 1J after self-aligned silicide layers are formed where the exterior surfaces of regions of silicon are exposed, including the top regions of the resistor ends 26B to form low resistance contact regions 36B and silicide layer 36C on the top surface of the doped, conductive polysilicon body 26C of the gate electrode stack 21C of the MOSFET, and silicide layers 33 on the top surfaces of the source-drain regions S/D. It is important that protective layer 20 blocks formation of silicide on the central, planar portion of device 21B, and the planar and sidewalls of device 21A as this would present a parallel low resistance path for conduction and a poorly controlled resistance value for the resistor.

Step L

Figure 1L:
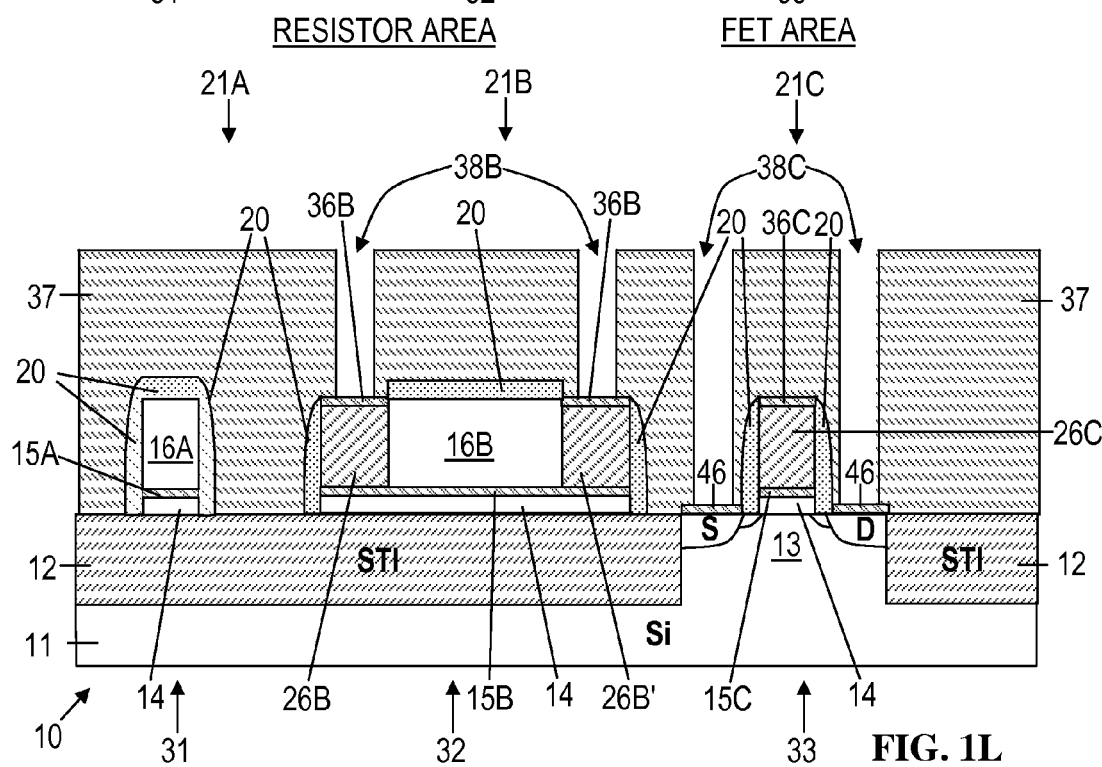

FIG. 1L shows the device 10 of FIG. 1K after an insulator layer 37 and contact holes 38B are formed over the contact regions 36B of the resistor stack 21B and contact holes 38C are formed over the contact regions 36C of the source/drains regions S/D as shown in FIG. 1L.

Step M

Figure 1M:
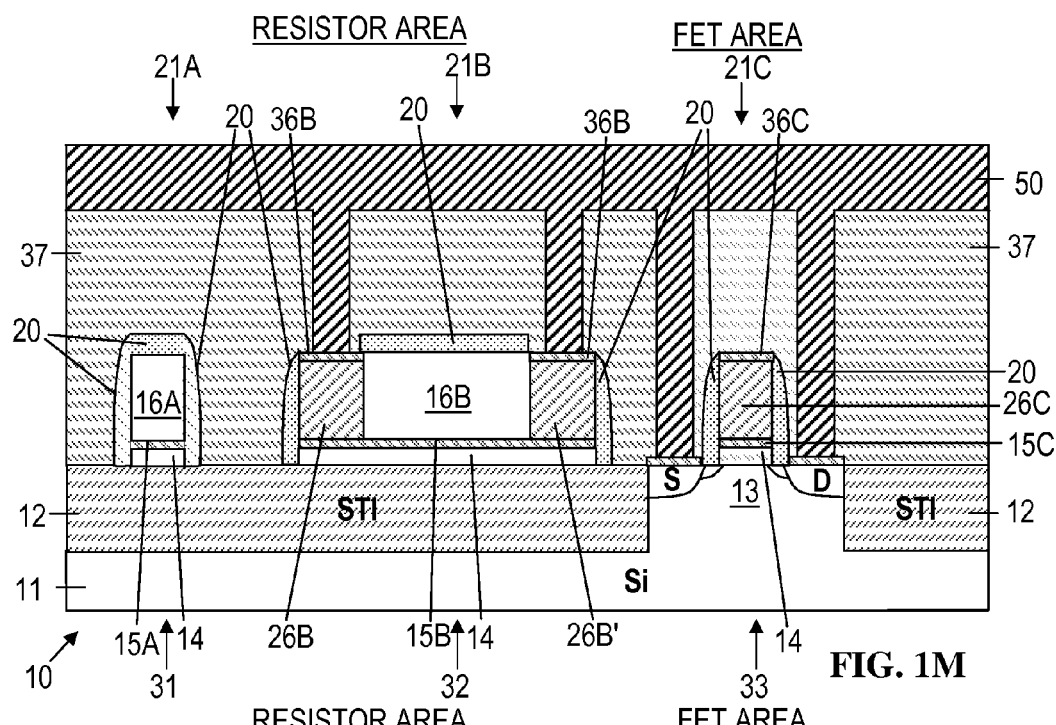

FIG. 1M shows the device 10 of FIG. 1L after metallization layer 50 has been formed over the insulator layer 37 and filling the contact holes 38B and 38C.

Step N

Figure 1N:
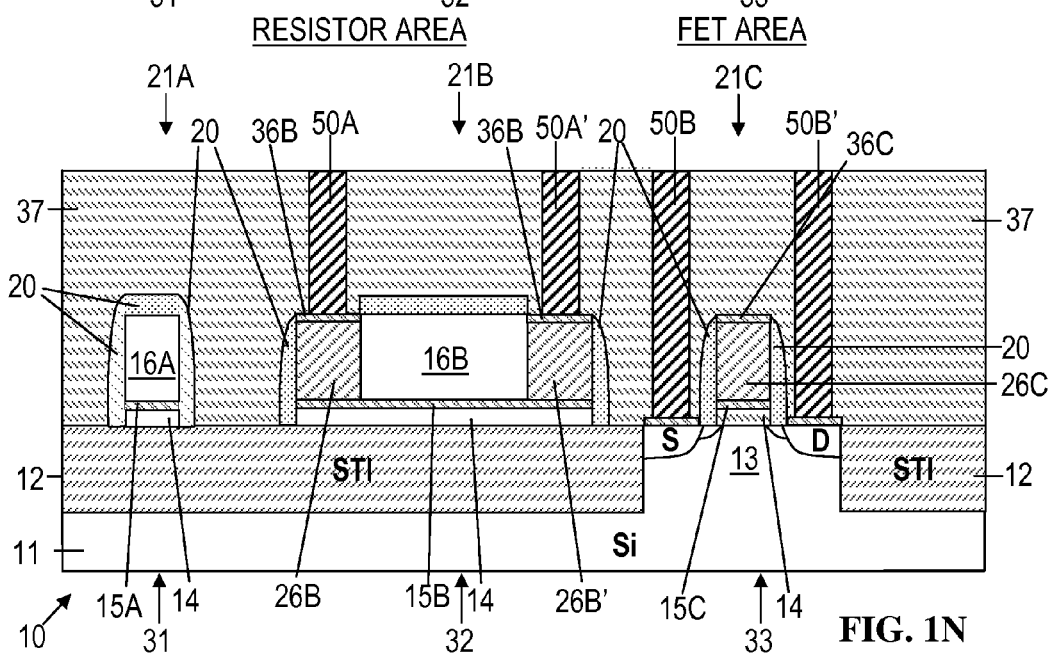

FIG. 1N shows the device 10 of FIG. 1M after planarization of the metallization layer 50. In general Step N can be followed by metal layers (not shown) such as needed to fabricate an integrated circuit.

Step O

Figure 1O:
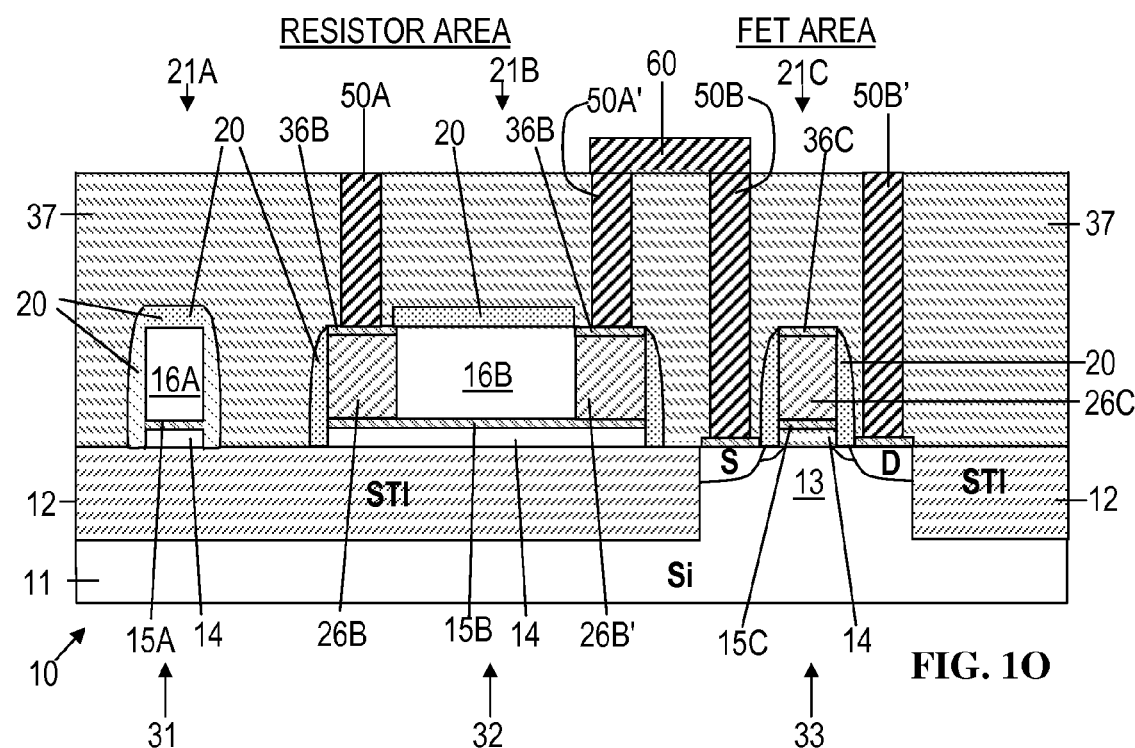

FIG. 1O shows the device 10 of FIG. 1M after forming metal interconnect 60 between the column 50A' which connects to terminal 26B' and column 50B which connects to the source region of the FET in the FET area 21C thereby connecting one terminal of the resistor 21B. This connection is shown for illustration that these devices are intended to be connected in some method. Actual connections between devices will depend on the intended function of the integrated circuit, and may employ multiple (stacked) metal layers (not shown here) and multiple devices of varying sizes and implant parameters, as will be well understood by those skilled in the art.

First Alternative Process

Figure 2:
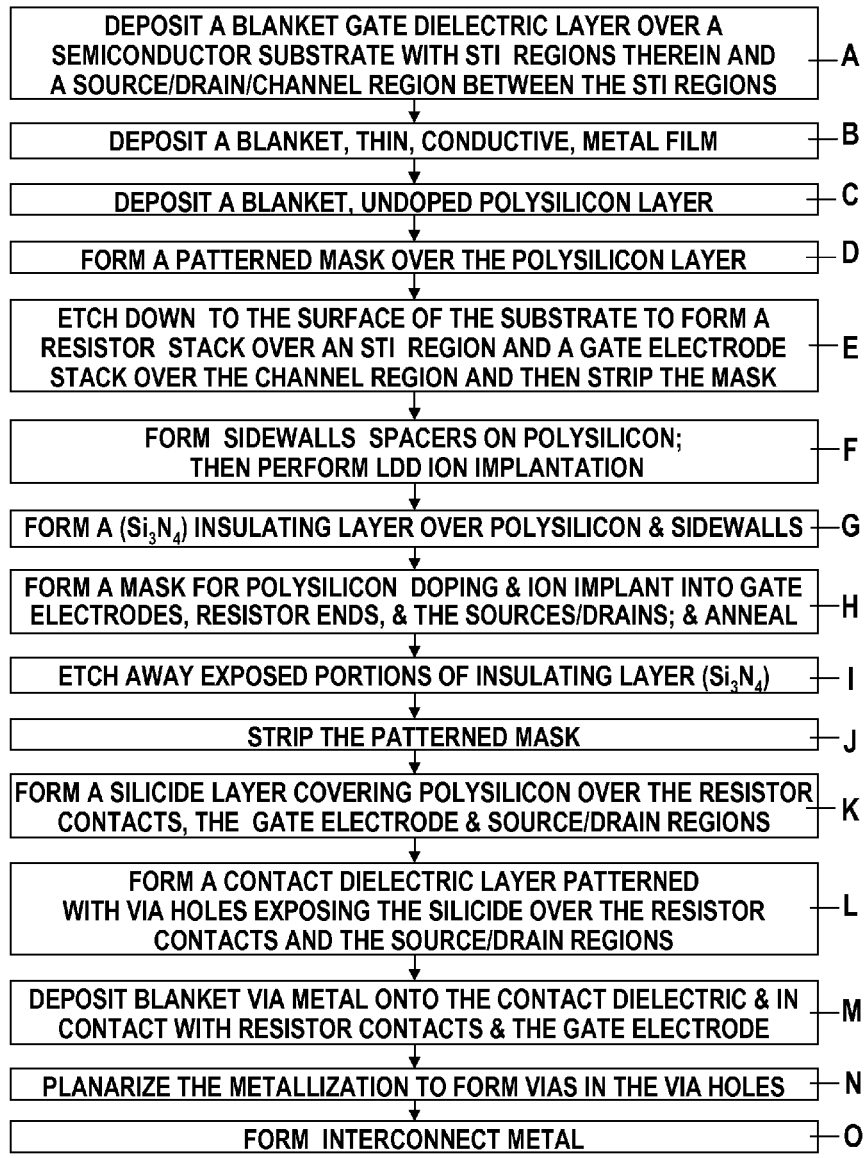
FIG. 2 shows a flow chart of the steps of the method of FIGS. 1A-1O.
Figure 3:
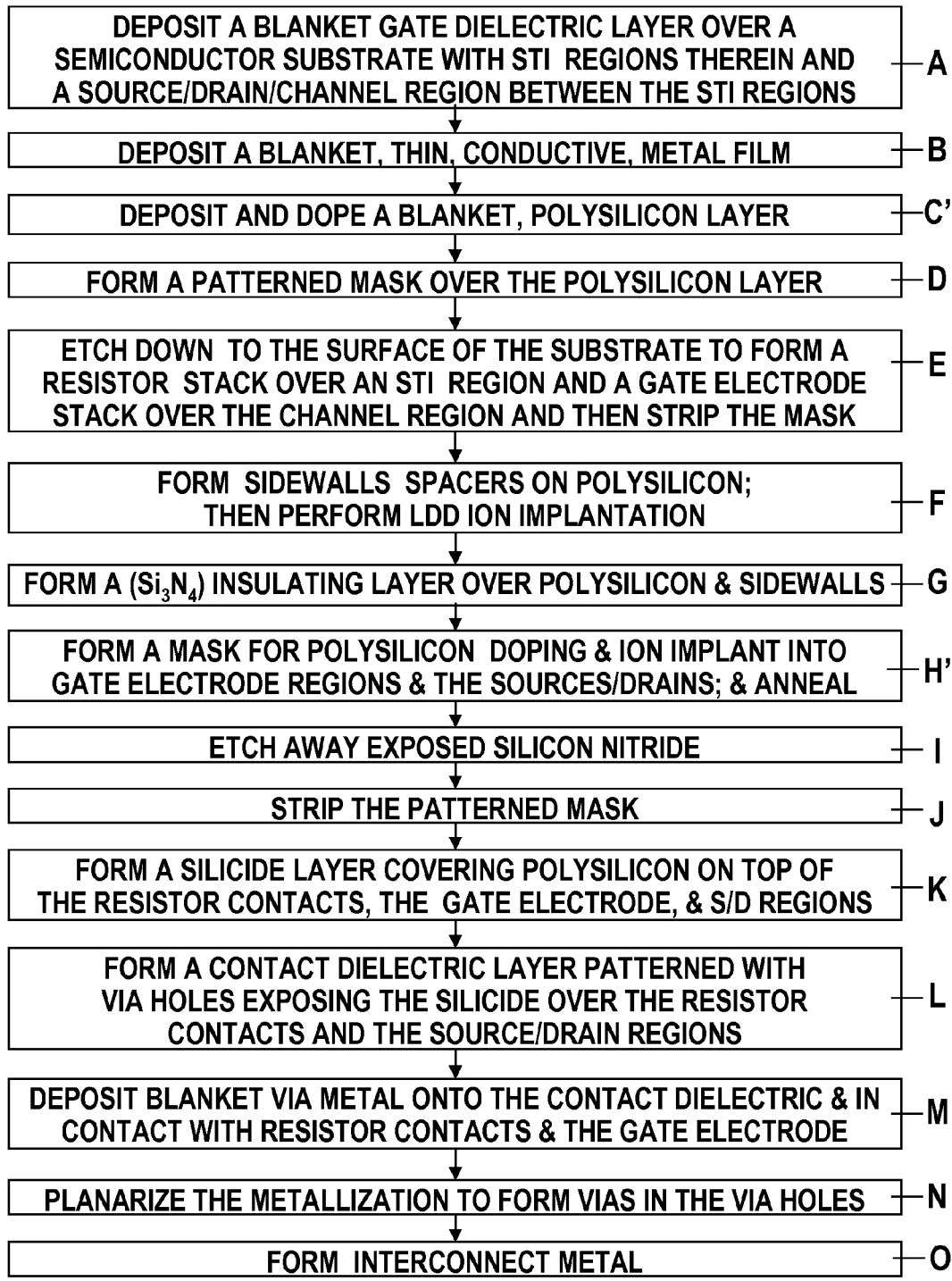
FIG. 3 shows a flow chart with a modification of some steps of the method of FIGS. 1A-1O.

FIG. 3 shows a flow chart with other modifications of some the steps of the method of FIGS. 1A-1N which is the same as FIG. 2 except for the modified Steps C' and H'.

Steps A and B

Steps A and B are performed in the identical manner described above with respect to FIGS. 1A-1B.

Step C'

FIG. 1C shows the device 10 of FIG. 1B following deposition of a blanket, undoped polysilicon layer 16 over the blanket metal layer 15 comprising the complementary layer of the dual layers to be formed into an electrical resistor juxtaposed with a gate electrode of a CMOS FET device. The blanket insulator layer 14, the blanket metal layer 15, and the blanket, undoped polysilicon layer 16 comprise a feature blanket 21 which can be patterned into various features. Alternatively, the polysilicon layer 16 may be in-situ doped or doped by an implantation step after deposition in step C.

Steps D-G

Steps D-G are performed in the identical manner described above with respect to FIGS. 1D-1G.

Step H'

In the previously mentioned alternate process and embodiment of Step C', the implantation of the ends of the resistor is optional, as a dopant is defined throughout the resistor polysilicon layer 16B.

Steps I-O

Steps I-O are performed in the identical manner described above with respect to FIGS. 1I-1O.

Second Alternative Process

Figure 4:
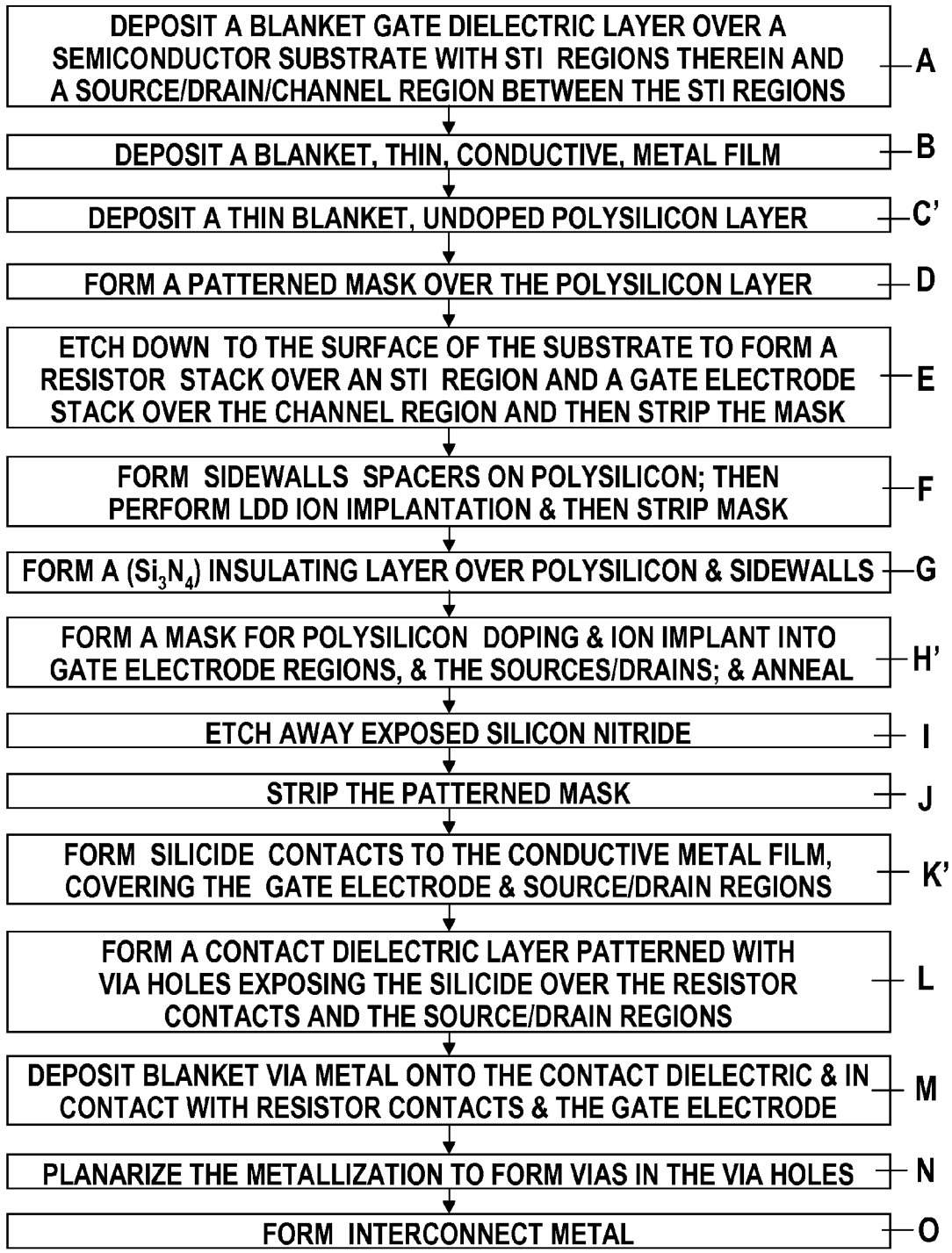
FIG. 4 shows a flow chart with other modifications of steps of the method of FIGS. 1A-1N.O FIG. 5F" shows the device 10 of FIG. 1E following Step F" which is a modification of Step F.

FIG. 4 is a flow chart with other modifications of some the steps of the method of FIGS. 1A-1N, which is the same as FIG. 2 except for the modified Steps C' and K'

Steps A-B

Steps A-B are performed in the identical manner described above with respect to FIGS. 1A-1B.

Step C"

FIG. 1C shows the device 10 of FIG. 1B following deposition of a blanket, undoped polysilicon layer 16 over the blanket metal layer 15 comprising the complementary layer of the dual layers to be formed into an electrical resistor juxtaposed with a gate electrode of a CMOS FET device. The blanket insulator layer 14, the blanket metal layer 15, and the blanket, undoped polysilicon layer 16 comprise a feature blanket 21 which can be patterned into various features. Alternatively, the polysilicon layer 16 may be in-situ doped or doped by an implantation step after deposition in step C. In this alternate process the polysilicon layer 16 must be deposited as a thin polysilicon layer.

Steps D-J

Steps D-J are performed in the identical manner described above with respect to FIGS. 1D-1J.

Step K'

A third embodiment leaves all intentional dopant out of the resistor layer, including the ends, and relies on connection with Silicide through the body to contact the metal region. In this third embodiment, it is preferred that the low resistance silicide contact region 36B directly contacts the metal layer 15B. This is accomplished if polysilicon layer 16 is thin enough such that the silicide layer 26B consumes the thickness of region 26B and forms contacts to the bottom metal layer 15B. This is not an additional step. If thickness of layer 16 is small enough then 26B will touch the bottom metal layer 15B. The silicide process consumes some or all of the thickness of layer 16. This is not allowed in processes without metal-gate because the silicide cannot touch the insulator (14) without unintended consequence in the FET. With metal gate, the silicide can touch the metal as explained here, without such adverse effects.

Steps L-O

Steps L-O are performed in the identical manner described above with respect to FIGS. 1L-1O.

Third Alternative Process

FIG. 5 is a flow chart with still other modifications of some the steps of the method of FIGS. 1A-1N, with the same steps as those of FIG. 2 except for the modified Steps F''', H''', and M' and the omission of Step G which has been added into the modified step F.

Steps A-E

Steps A-E are performed in the identical manner described above with respect to FIGS. 1A-1E.

Step F'''

Figure 5F:
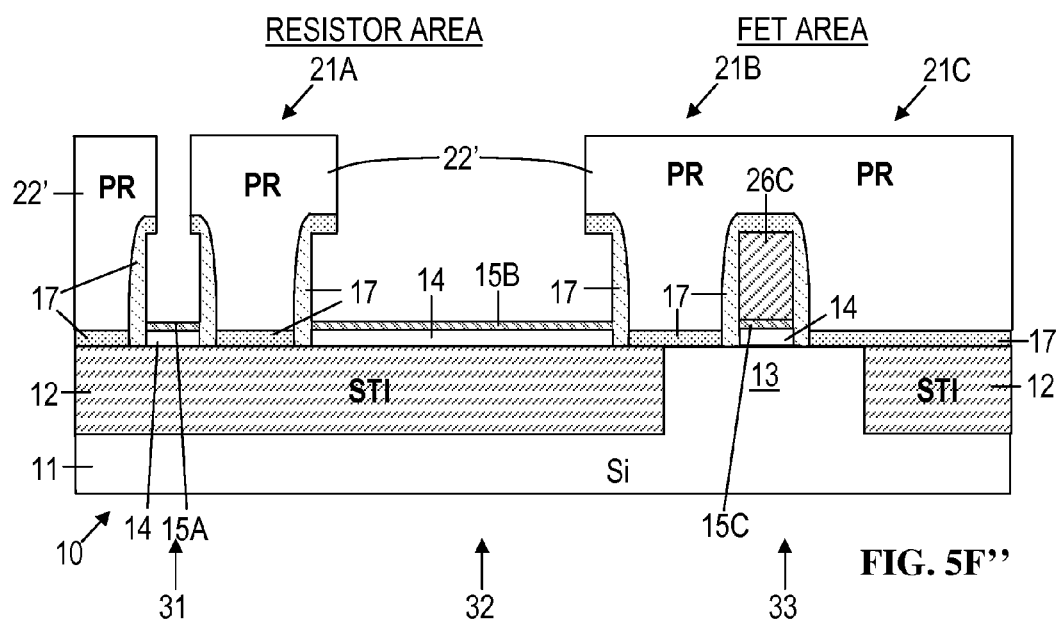
FIG. 5M' shows the device 10 of FIG. 1E following step M' in which the process of Step M is modified slightly.

FIG. 5F''' shows the device 10 of FIG. 1E following Step F''' which is a modification of Step F in which a blanket insulating layer 17 is formed over the device 10. Then a photoresist mask 22' is formed with an opening over the center of the undoped resistor polysilicon layer 16A and 16B of the dual layer. The next function in Step F''' is to etch through the exposed portions of the blanket insulating layer 17 to expose top surfaces of the undoped resistor polysilicon layer 16A and 16B of the dual layer resistors. Then etching continues through the mask and the undoped resistor polysilicon layer 16A and 16B through the top surfaces of the undoped resistor polysilicon layer 16A and 16B removing all of the undoped resistor polysilicon layer 16A and 16B and exposing the entire top surface of the two metal resistor elements 15A and 15B leaving the surfaces thereof including the opposite ends thereof exposed. Then Step F''' ends by stripping away the photoresist mask 22'

Steps G

Steps G is performed in the identical manner described above with respect to FIG. 1G.

Step H'''

FIG. 5H''' shows the device 10 of FIG. 1G following Step H''' form a mask and ion implant dopant into gate electrode 33 and the source region S and the drain region D and then anneal.

Steps I-L

Steps I-L are performed in the identical manner described above with respect to FIGS. 1I-1L.

Step M'

Figure 5M:
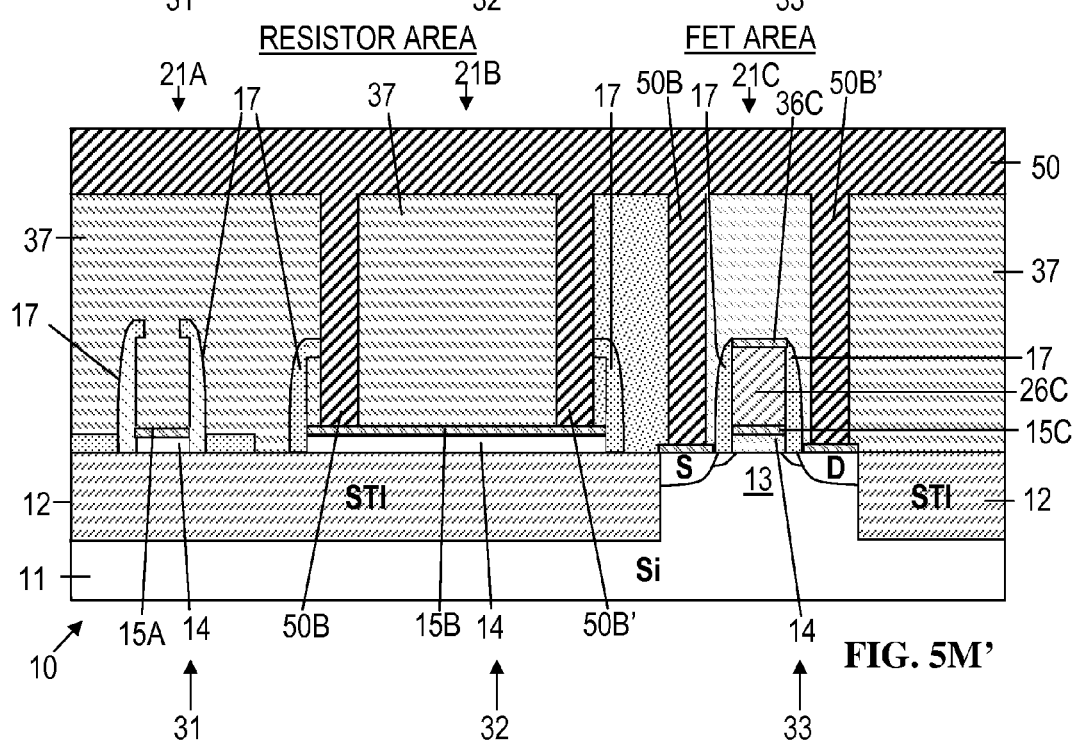

FIG. 5M' shows the device 10 of FIG. 1E following step M' in which the process of Step M is modified slightly in that the vias 50B and 50B' are formed extending down through contact holes through the insulator layer 37 into direct contact with the distal ends of the two metal resistor elements 15A and 15B with the ends of resistor element 15A (which extends into the page) not shown, as the are outside of the plane of the drawing.

Step O

Step O is performed in the identical manner described above with respect to FIG. 1O.

Figure 6:
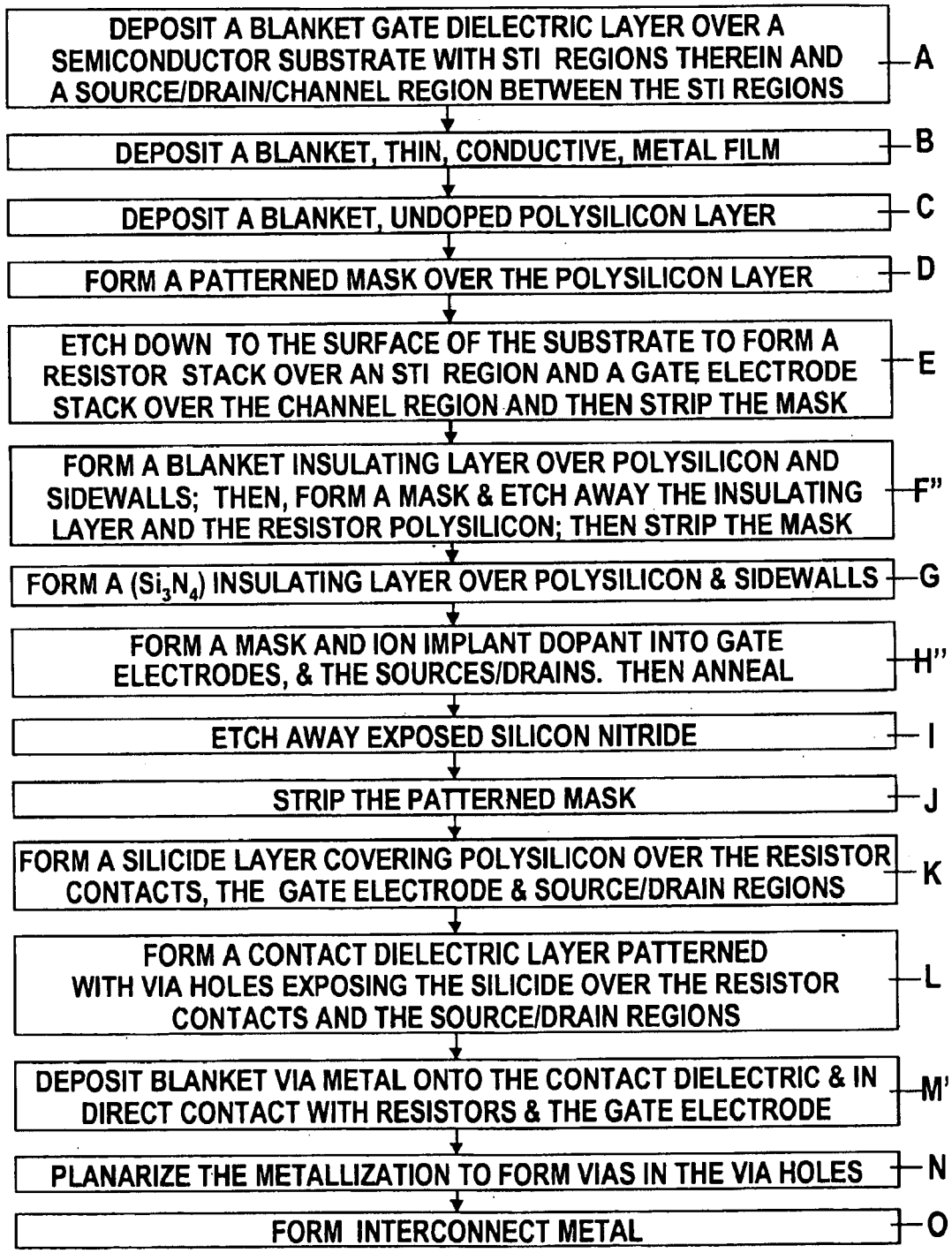
FIG. 6 is a flow chart with still other modifications of steps of the method of FIGS. 1A-1N.

FIG. 6 is a flow chart with still other modifications of some the steps of the method of FIGS. 1A-1N, with the same steps as those of FIG. 2 except for the modified Steps F''', H''', and M' and the omission of Step G which has been added into the modified step F.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the following claims.

We claim:

1. A method of forming an integrated semiconductor device on a semiconductor substrate with a channel region and STI regions formed therein including a Field Effect Transistor (FET) device formed in and over said channel region adjacent to a resistor which is formed on a said STI region, said method comprising:

forming a stack of layers on said substrate including a dielectric layer formed on said substrate, a conductive layer formed on said dielectric layer and an undoped polysilicon layer formed on said conductive layer;

forming both an FET stack for said FET device over said channel region and a resistor stack for said resistor over a said STI region by patterning, and etching said dielectric layer, said conductive layer and said polysilicon layer with said resistor being formed from said conductive layer, with said resistor having distal ends, and with said gate electrode stack including portions of said dielectric layer, said conductive layer and said polysilicon layer;

implanting dopant into said polysilicon layer of said FET stack to form a doped polysilicon gate electrode for said FET device; and forming electrical connections to said conductive layer of said resistor between said distal ends.

2. The method of claim 1 wherein said conductive layer has a resistivity from 50 to 500 Ohms/square, with a thickness in the range of 1-7 nm.

3. The method of claim 1 wherein:
said dielectric layer comprises a High-K material;
said conductive layer is composed of a material selected from the group consisting of titanium nitride (TiN) and tantalum carbide (TaC); and
said conductive layer has a from 50 to 500 Ohms/square, with a thickness in the range of 1-7 nm.

4. A method of forming an integrated semiconductor device on a semiconductor substrate with a channel region and Shallow Trench Isolation (STI) regions formed therein including a Field Effect Transistor (FET) device formed in and over said channel region adjacent to a resistor formed on a said STI region comprising:
forming a stack of layers on said substrate including a dielectric layer formed on said substrate, a conductive layer formed on said dielectric layer and an undoped polysilicon layer formed on said conductive layer;
forming both an FET stack for said FET device over said channel region and a resistor stack for said resistor over a said STI region by patterning, and etching said dielectric layer, said conductive layer and said polysilicon layer with said resistor being formed from said conductive layer, with said resistor having distal ends, and with said gate electrode stack including portions of said dielectric layer, said conductive layer and said polysilicon layer;
implanting dopant into said polysilicon layer of said FET stack to form a doped polysilicon gate electrode for said FET device and implanting dopant into said polysilicon layer over distal ends of said resistor without implanting dopant into said polysilicon layer between said distal ends, thereby forming electrical connections to said conductive layer of said resistor between said distal ends.

5. The method of claim 4 including the following steps:
forming resistor terminals connected to said distal ends of said resistor stack;
forming FET terminals connected to said FET device; and
connecting one of said resistor terminals to one of said FET terminals.

6. The method of claim 4 wherein said dielectric layer comprises a High-K material.

7. The method of claim 4 wherein said dielectric layer comprises a High-K material group consisting of hafnium based materials.

8. The method of claim 4 wherein said dielectric layer comprises a High-K material comprising a material selected from the group consisting of hafnium zirconate ($HfZrO_4$), hafnium silicon oxynitride (HfSiON), hafnium dioxide ($HfO_2$) and hafnium silicate (HfSiO).

9. The method of claim 4 wherein:
said dielectric layer comprises a High-K material; and
said conductive layer is composed of a material selected from the group consisting of titanium nitride (TiN) and tantalum carbide (TaC).

10. The method of claim 4 wherein:
said polysilicon in said distal ends comprises doped polysilicon and central regions of said polysilicon between said distal ends is undoped; and
said conductive layer is composed of a material selected from the group consisting of titanium nitride (TiN) and tantalum carbide (TaC).

11. The method of claim 4 including the step of forming silicide contacts from said polysilicon layer reaching down to said metal conductor layer.

12. The method of claim 4 wherein said conductive layer has a resistivity layer, from 50 to 500 Ohms/square, with thickness the range of 1-7 nm.

13. A method of forming an integrated semiconductor device on a semiconductor substrate with a channel region and Shallow Trench Isolation (STI) regions formed therein including a Field Effect Transistor (FET) device formed in and over said channel region adjacent to a resistor formed on a said STI region comprising:
forming a stack of layers on said substrate including a dielectric layer formed on said substrate, a conductive layer formed on said dielectric layer, and an undoped polysilicon layer on said conductive layer;
forming an FET stack over said channel region and a resistor stack over a said STI region by patterning and etching said dielectric layer, said conductive layer, and said polysilicon layer with said resistor being formed from a resistor portion of said conductive layer, with said resistor having distal ends, and with said gate electrode stack including portions of said dielectric layer, said conductive layer and said polysilicon layer;
etching away said polysilicon from said resistor stack over said resistor from said conductive layer, with said resistor having distal ends;
implanting dopant into said FET stack to form a doped FET gate electrode for said FET device from said undoped polysilicon layer; and
depositing via metal into direct contact with said distal ends of said resistor.

14. The method of claim 13 including the steps as follows:
forming resistor terminals connected to said distal ends;
forming FET terminals connected to said FET device; and
connecting one of said resistor terminals to one of said FET terminals.

15. The method of claim 13 wherein said dielectric layer comprises a High-K material.

16. The method of claim 13 wherein said dielectric layer comprises a High-K material group consisting of hafnium based materials.

17. The method of claim 13 wherein said dielectric layer comprises a High-K material comprising a material selected from the group consisting of hafnium zirconate ($HfZrO_4$), hafnium silicon oxynitride (HfSiON), hafnium dioxide ($HfO_2$) and hafnium silicate (HfSiO).

18. The method of claim 13 wherein:
said dielectric layer comprises a High-K material; and
said conductive layer is composed of a material selected from the group consisting of titanium nitride (TiN) and tantalum carbide (TaC).

19. The method of claim 13 wherein said conductive layer has a resistivity from 50 to 500 Ohms/square, with a thickness in the range of 1-7 nm.

* * * * *